US009221979B2

(12) United States Patent
Ito et al.

(10) Patent No.: US 9,221,979 B2
(45) Date of Patent: Dec. 29, 2015

(54) COPPER PARTICLES, COPPER PASTE, PROCESS FOR PRODUCING CONDUCTIVE COATING FILM, AND CONDUCTIVE COATING FILM

(75) Inventors: Chiho Ito, Otake (JP); Takeshi Yatsuka, Otake (JP); Yasuo Kakihara, Otake (JP)

(73) Assignee: TODA KOGYO CORPORATION, Otake (JP)

(*) Notice: Subject to any disclaimer, the term of this patent is extended or adjusted under 35 U.S.C. 154(b) by 0 days.

(21) Appl. No.: 14/117,970

(22) PCT Filed: May 17, 2012

(86) PCT No.: PCT/JP2012/062658
§ 371 (c)(1),
(2), (4) Date: Feb. 24, 2014

(87) PCT Pub. No.: WO2012/157704
PCT Pub. Date: Nov. 22, 2012

(65) Prior Publication Data
US 2014/0203222 A1    Jul. 24, 2014

(30) Foreign Application Priority Data

May 18, 2011   (JP) .................. 2011-111872
Dec. 28, 2011  (JP) .................. 2011-289317

(51) Int. Cl.
*B22F 1/00* (2006.01)
*C09D 5/24* (2006.01)
(Continued)

(52) U.S. Cl.
CPC .............. *C09D 5/24* (2013.01); *B22F 1/0011* (2013.01); *B22F 1/0074* (2013.01); *B22F 7/04* (2013.01);
(Continued)

(58) Field of Classification Search
CPC ............ B22F 1/00; H01B 5/14; H01B 13/00; H01B 1/02; H01B 1/026; H05K 3/12; C09D 5/24
USPC ............................ 252/512; 427/123; 242/469
See application file for complete search history.

(56) References Cited

U.S. PATENT DOCUMENTS 7,985,527 B2 *  7/2011  Tokunaga ................. 430/270.1
2001/0002558 A1 *  6/2001  Sano et al. ................. 75/373
(Continued)

FOREIGN PATENT DOCUMENTS

JP    2001-220607    8/2001
JP    2007-157563    6/2007
(Continued)

OTHER PUBLICATIONS

International Search Report for PCT/JP2012/062658, mailed Aug. 21, 2012.
(Continued)

*Primary Examiner* — Mark Kopec
*Assistant Examiner* — Danny N Kang
(74) *Attorney, Agent, or Firm* — Nixon & Vanderhye P.C.

(57) ABSTRACT

There are provided copper particles and a copper paste for a copper powder-containing coating film which can be subjected to electroless metal plating without using an expensive catalyst such as palladium, and a process for producing a conductive coating film by subjecting a copper powder-containing coating film formed by using the copper paste to electroless metal plating or heat treatment with superheated steam. The present invention relates to a process for producing a conductive coating film comprising the step of forming a coating film on an insulating substrate using copper particles having an average particle diameter of 0.05 to 2 μm as measured by observation using SEM in which a BET specific surface area value (SSA) ($m^2/g$) and a carbon content (C) (% by weight) of the copper particles satisfy a relationship represented the following formula [1]: $C/SSA \cdot 7 \times 10^{-2}$ [1], and a copper paste comprising the copper particles; drying the coating film to obtain a copper powder-containing coating film; and then subjecting the resulting coating film to electroless metal plating or heat treatment with superheated steam.

8 Claims, 1 Drawing Sheet

(51) Int. Cl.
*H01B 1/02* (2006.01)
*H01B 1/22* (2006.01)
*H05K 1/09* (2006.01)
*C22C 1/04* (2006.01)
*B22F 7/04* (2006.01)
*B22F 9/24* (2006.01)

(52) U.S. Cl.
CPC ............. *C22C 1/0425* (2013.01); *H01B 1/026* (2013.01); *H01B 1/22* (2013.01); *H05K 1/095* (2013.01); *B22F 9/24* (2013.01); *B22F 2998/10* (2013.01); *H05K 2201/0272* (2013.01); *H05K 2201/0323* (2013.01)

(56) References Cited

U.S. PATENT DOCUMENTS

2006/0044098 A1 * 3/2006 Kimura et al. ................. 336/122
2007/0125195 A1 6/2007 Akimoto et al.
2009/0296311 A1 * 12/2009 Otsuka et al. ............. 361/306.3

FOREIGN PATENT DOCUMENTS

| | | |
|---|---|---|
| JP | 2009-074152 | 4/2009 |
| JP | 2011-058068 | 3/2011 |
| JP | 2011-060653 | 3/2011 |
| JP | 2011-094236 | 5/2011 |
| JP | 4853590 | 1/2012 |
| WO | 2004/053901 | 6/2004 |
| WO | WO 2009038207 A1 * | 3/2009 |
| WO | 2010/095672 | 8/2010 |

OTHER PUBLICATIONS

International Preliminary Report on Patentability in PCT/JP2012/062658 ated Nov. 28, 2013.

\* cited by examiner

COPPER PARTICLES, COPPER PASTE, PROCESS FOR PRODUCING CONDUCTIVE COATING FILM, AND CONDUCTIVE COATING FILM

This application is the U.S. national phase of International Application No. PCT/JP2012/062658, filed 17 May 2012, which designated the U.S. and claims priority to Japan Application No. 2011-111872, filed 18 May 2011, and Japan Application No. 2011-289317, filed 28 Dec. 2011, the entire contents of each of which are hereby incorporated by reference.

TECHNICAL FIELD

The present invention relates to copper particles (powder) for copper pastes and a copper paste which are suitably used in electroless metal plating for production of a conductive coating film, a process for producing a conductive coating film by subjecting a copper powder-containing coating film obtained by using the copper paste to electroless metal plating, as well as processes for producing copper particles for copper pastes and a copper paste which are capable of forming a conductive coating film by subjecting a copper powder-containing coating film formed on an insulating substrate using the conductive paste to heat treatment with superheated steam, and a conductive coating film having a high electric conductivity which is produced by these production processes.

BACKGROUND ART

In recent years, there is rapid progress of conductive circuits with a high density. The conventional subtractive process used for forming the conductive circuits in which a copper foil laminated on an insulating substrate is etched for patterning thereof requires a prolonged time and is complicated, resulting in production of a large amount of wastes. In consequence, instead of the subtractive process, a printing process or a coating process using a conductive paste comprising conductive particles to form the conductive circuits has been noticed. For example, in a screen printing method generally used for circuit printing, flake-like metal particles having a particle diameter of not less than several micrometers or the like are used as the conductive particles to form a circuit having a thickness of not less than 10 μm and thereby ensure a conductivity thereof. In order to form a circuit having a higher density, still finer metal particles have been developed.

Hitherto, as a conductive material formed on circuit boards, there has been used a paste obtained by using metal particles such as particles of copper, silver, a copper alloy, gold, platinum, silver-palladium, etc. Among these metals, in view of conductivity and stability with time, silver, gold, platinum and silver-palladium, in particular, silver, are generally used as the conductive particles. However, gold, platinum and silver-palladium are not only expensive by themselves but also have such a problem that these sources will be exhausted in near future, and silver further has the problem concerning ion migration generated between circuits under high-temperature and high-humidity conditions.

In consequence, it has been attempted that copper as a more inexpensive and rich source and a copper alloy are used as alternative conductive metal particles in place of silver. For example, metal fine particles having a particle size of not more than 100 nm are extremely active unlike ordinary metal particles having a particle size of not less than several micrometers and therefore undergoes a phenomenon of lowering of melting point. With respect to copper, study has also been made on low-temperature calcination utilizing the phenomenon of lowering of melting point.

However, since copper particles tend to readily form an oxide layer on a surface thereof, there tends to arise such a problem that the copper particles are deteriorated in conductivity owing to the oxide layer. In addition, as the particle size of the copper particles is reduced, the adverse influence of the oxide layer on a conductivity of the particles tends to become more remarkable. In consequence, in order to reduce the oxide layer on the copper particles, it is required that the copper particles are subjected to reducing treatment at a temperature exceeding 300° C. in a reducing atmosphere such as hydrogen or to sintering treatment at a much higher temperature. At this time, the conductivity of the copper particles becomes closer to that of a bulk copper. However, even the thus treated copper particles can be used only in limited applications in which an insulating substrate used therewith must be formed of a high heat-resistant material such as ceramic materials and glass.

As the method of forming a conductive coating film, there is known a plating method. Further, as the plating method, there are known a full additive process in which only a wiring portion of an insulating substrate is subjected to electroless plating, a semi-additive process using resist printing in combination with electroplating, and a panel plating process in which an insulating substrate having through-holes is successively subjected to electroless plating and then copper electroplating to form a copper plating layer thereon and thereafter etch the copper plating layer.

In the conventional arts, there is known the method in which a undercoat layer for electroless plating is provided on an insulating substrate, and then the insulating substrate is subjected to electroless plating to form an electroless plating layer on the undercoat layer. In Patent Document 1, it is described that a composite metal oxide hydrate comprising Pd or Ag and a binder are used as raw materials for forming a undercoat layer for electroless plating. In Patent Document 2, it is described that a surface of a pattern formed from a metal paste is subjected to sensitization treatment and then to electroless plating. In Patent Document 3, it is described that only a circuit portion having a specific resistance value of not more than 10·cm which is formed of a conductive paste is subjected to electroless plating.

However, in the above conventional arts, the electroless plating process requires an activation treatment using palladium in order to enhance a deposition ability or a selectivity for the plating. Palladium is not only expensive, but also requires a complicated process maintenance including previous or subsequent steps for the activation treatment.

In addition, in the electroless copper plating process used for forming circuits, formaldehyde is generally used as a reducing agent. In general, such a plating process using formaldehyde has been conducted in the presence of a strong alkali and under high-temperature conditions in order to enhance an activity of the formaldehyde. As a result, there tends to occur deterioration in adhesion between the plating layer and the insulating substrate as well as occurrence of defects on the plating layer. These drawbacks are one of causes inhibiting spread of such a circuit forming method in which after printing a circuit using a copper paste, a conductive circuit is formed thereon by electroless copper plating.

In addition, in the above conventional arts, there are known no methods in which an electroless plating layer is formed on a metal paste coating film without adding a noble metal such as Ag to the paste and without conducting an activation treatment using palladium or a sensitization treatment. Therefore, characteristics of copper particles for forming a electroless plating layer without conducting these treatments have been not apparently recognized.

Also, conventionally, for the purpose of preventing oxidation of copper fine particles, there has been attempted the method of treating the surface of the particles with benzotriazole or derivatives thereof, an organic amine, a fatty acid, a metal alkoxide, etc. In Patent Document 4, there are described copper fine particles treated with a fatty acid. However, it is not possible to produce a high-quality electroless plating layer on a coating film formed of a paste using the copper particles having such a surface treatment layer.

In addition, in Patent Document 5, there are described copper fine particles having a particle diameter of 20 to 41 nm which are produced by a liquid phase method. In Patent Document 6, there is described the method for producing metal fine particles from a metal compound in a liquid phase using a polyol as a reducing agent.

Also, in Patent Documents 5 and 7, it is described that a copper paste coating film is subjected to heat treatment in a nitrogen atmosphere at a temperature of 300 to 350° C. for 1 hr to thereby obtain a thin film having an excellent conductivity. However, the fine particles have a very large surface area and therefore are likely to be extremely readily oxidized, so that there tend to arise the problems such as deterioration in conductivity of the particles and increase in temperature required upon calcination thereof. As a result, it may be difficult to form a conductive coating film having a low volume resistivity on a substrate formed of a material having a relatively low heat resistance such as organic materials. In particular, the copper fine particles tend to suffer from defects owing to oxidation thereof, and therefore tend to be deteriorated in conductivity.

In addition, in Patent Document 8, it is described that in order to reduce an oxide layer of purified copper particles, a cupric oxide dispersion comprising ethylene glycol is treated with a hydrogen gas at 250° C. to obtain a copper thin film having an excellent conductivity. However, the method fails to provide a suitable method having a high productivity because the high-temperature treatment is conducted in the highly explosive hydrogen gas.

In consequence, for the purpose of preventing oxidation of copper fine particles, there has been attempted the method of treating the surface of the particles with benzotriazole or derivatives thereof, an organic amine, a fatty acid, a metal alkoxide, etc. In Patent Document 4, there are described copper particles treated with a fatty acid. However, when removing such a surface treatment layer, it is also required to conduct a heat treatment in a high-temperature atmosphere, so that it may be difficult to obtain a conductive coating film on a substrate formed of a resin film, etc.

Also, in Patent Document 9, there has been proposed the method of enhancing a conductivity of a coating film formed of a dispersion of metal fine particles by subjecting the coating film to heat treatment with superheated steam. However, the characteristics of copper particles which exhibit a good conductivity when subjected to the superheated steam treatment have been not clearly determined therein.

For example, in the case where copper particles are subjected to surface treatments for the purpose of suppressing oxidation of the copper particles or preventing increase in viscosity of a paste upon preparation thereof, the activity on the surface of the copper particles can be suppressed, so that a storage property of the copper particles and a stability of the paste can be enhanced. However, the effects of the heat treatment with superheated steam also tend to be suppressed by the surface treatments, so that it is not possible to obtain a conductive coating film having an excellent conductivity.

CITATION LIST

Patent Literature

Patent Document 1: Japanese Patent Application Laid-Open (KOKAI) No. 9-135097
Patent Document 2: Japanese Patent Application Laid-Open (KOKAI) No. 6-132636
Patent Document 3: Japanese Patent Application Laid-Open (KOKAI) No. 58-92293
Patent Document 4: Japanese Patent Application Laid-Open (KOKAI) No. 2002-332502
Patent Document 5: Japanese Patent Application Laid-Open (KOKAI) No. 2008-31491
Patent Document 6: Japanese Patent Publication (KOKOKU) No. 4-24402
Patent Document 7: Japanese Patent Application Laid-Open (KOKAI) No. 2006-228879
Patent Document 8: International Patent Application Laid-Open No. WO 2003/051562
Patent Document 9: International Patent Application Laid-Open No. WO 2010/095672

SUMMARY OF THE INVENTION

Problem to be Solved by the Invention

An object of the present invention is to provide copper particles and a copper paste for a copper powder-containing coating film which can be subjected to electroless metal plating without using an expensive catalyst such as palladium upon production of a conductive coating film, and a process for efficiently producing a conductive coating film by subjecting a copper powder-containing coating film formed by using the copper paste to electroless metal plating.

In addition, another object of the present invention is to provide copper particles for copper pastes and a copper paste which can form a conductive coating film having a high conductivity by subjecting a copper powder-containing coating film formed on an insulating substrate using a conductive paste comprising the copper particles to heat treatment with superheated steam, and a process for efficiently producing a conductive coating film having a high conductivity by subjecting a copper powder-containing coating film formed by using the copper paste to heat treatment with superheated steam.

Means for Solving the Problem

As a result of the present inventors' earnest study for solving the above conventional problems, the present invention has been attained. That is, the present invention includes the following aspects.

Invention (1): Copper particles having an average particle diameter of 0.05 to 2 μm as measured by observation using SEM, a BET specific surface area value (SSA) (m$^2$/g) and a carbon content (C) (% by weight) of the copper particles satisfying a relationship represented the following formula [1]:

$$C/SSA \cdot 7 \times 10^{-2} \qquad [1].$$

Invention (2): The copper particles as described in the above Invention (1), wherein the BET specific surface area value (SSA) (m$^2$/g) and an oxygen content (O) (% by weight) of the copper particles satisfy a relationship represented by the following formula [2]:

$$O/SSA \cdot 0.2 \qquad [2].$$

Invention (3): A copper paste comprising the copper particles as described in the above Invention (1) or (2), an organic binder and a solvent.

Invention (4): The copper paste as described in the above Invention (3), further comprising a curing agent.

Invention (5): The copper paste as described in the above Invention (3) or (4), wherein a content of the organic binder resin in the copper paste is 2 to 30 parts by weight based on 100 parts by weight of the copper particles.

Invention (6): A process for producing a conductive coating film, comprising the steps of:

forming a coating film on an insulating substrate using the copper paste as described in any one of the above Inventions (3) to (5);

drying the coating film to obtain a copper powder-containing coating film; and then subjecting the resulting coating film to heat treatment with superheated steam.

Invention (7): A process for producing a conductive coating film, comprising the steps of:

forming a coating film on an insulating substrate using the copper paste as described in any one of the above Inventions (3) to (5);

drying the coating film to obtain a copper powder-containing coating film; and then subjecting the resulting coating film to electroless metal plating.

Invention (8): A conductive coating film produced by the process as described in the above Invention (6) or (7).

Effect of the Invention

It is considered that the copper particles and the copper paste according to the present invention can exhibit an enhanced suitability for electroless metal plating of a copper powder-containing coating film formed from the copper paste by controlling an activity of the surface of the copper particles. Therefore, in the process for producing a conductive coating film according to the present invention, it is possible to efficiently produce a conductive coating film having a high conductivity by subjecting the copper powder-containing coating film to electroless metal plating without using an expensive catalyst such as palladium.

The copper particles and the copper paste according to the present invention are capable of producing a conductive coating film having a high conductivity without conducting a reducing treatment in a hydrogen atmosphere and a heat treatment at a high temperature by forming a copper powder-containing coating film on an insulating substrate using the conductive paste containing the copper particles and then subjecting the copper powder-containing coating film to superheated steam treatment.

PREFERRED EMBODIMENTS FOR CARRYING OUT THE INVENTION

Figure 1:
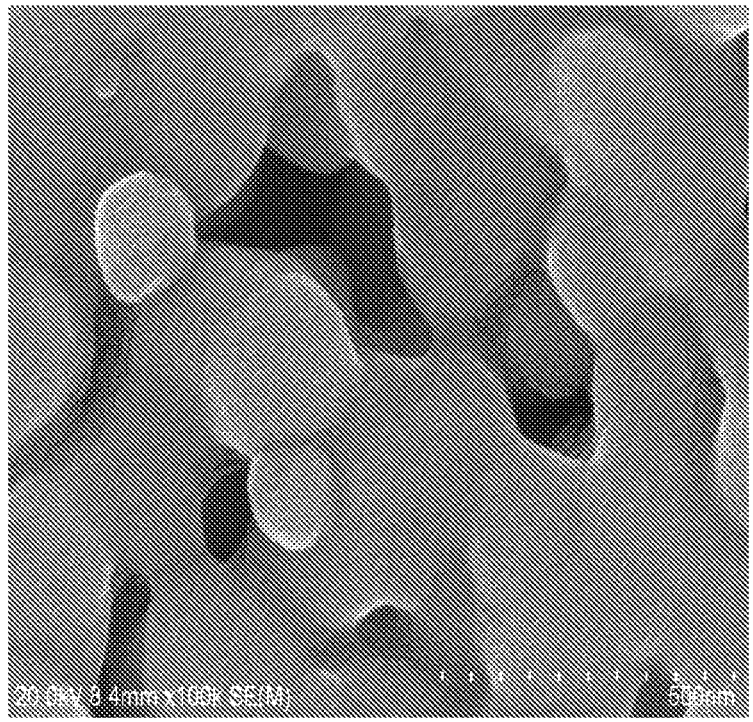
FIG. 1 is an SEM micrograph of a conductive coating film obtained in Example 2-3.

The copper particles according to the present invention are in the form of particles formed of copper solely or copper alloy particles comprising copper in an amount of not less than 80% by weight. As the copper particles, there may be used copper fine particles or the like which are produced by a wet reducing process, a vapor phase reducing process or an atomizing process in which the production method or storage method is controlled during the process of producing copper particles so as to obtain specific copper particles defined in the present invention. Among them, there are preferably used copper particles that are produced by a wet reducing process in which fine particles having a well-controlled particle diameter are obtained using a simple production facility.

The copper particles according to the present invention have an average particle diameter of 0.05 to 2 μm. When the average particle diameter of the copper particles is more than 2 μm, the conductive coating film obtained after plating tends to be deteriorated in smoothness, and it may be difficult to form a fine wiring pattern on an insulating substrate. Also, when subjecting the conductive coating film to superheated steam treatment, the conductive coating film obtained after the treatment tends to be deteriorated in smoothness, and it is not possible to obtain a conductive coating film having a high conductivity owing to a low reactivity thereof. On the other hand, when the average particle diameter of the copper particles is less than 0.05 μm, the copper particles tend to exhibit a considerably high reactivity on a surface thereof, and tend to suffer from considerable progress of formation of a surface oxide layer, so that the coating film obtained by electroless plating tends to suffer from film defects and thereby fail to exhibit a good conductivity. Further, when being subjected to superheated steam treatment, it is not possible to obtain a coating film having a high conductivity whose surface activity is suppressed. When subjecting the resulting coating film to plating treatment, the average particle diameter of the copper particles is preferably 0.15 to 1 μm and more preferably 0.2 to 0.7 μm, whereas when subjecting the resulting coating film to superheated steam treatment, the average particle diameter of the copper particles is preferably 0.08 to 1 μm and more preferably 0.1 to 0.5 μm.

The average particle diameter of the copper particles as described above may be determined from an average value of particle diameters of the 100 copper particles on a micrograph observed by a scanning electron microscope. In the present invention, there may be used a mixture of copper particles that are different in particle diameter from each other, as long as the average particle diameter of the copper particles lies within the range of 0.05 to 2 μm. The shape of the copper particles may be any of a generally spherical shape, a dendritic shape, a flake-like shape or the like. Among these shapes, from the standpoint of enhancing a density of the coating film before the treatment, preferred are a generally spherical shape and a flake-like shape.

The copper particles according to the present invention preferably have a BET specific surface area value (SSA) of 0.4 to 16.0 m$^2$/g, and more preferably 1.0 to 5.0 m$^2$/g. When the BET specific surface area value of the copper particles is less than 0.4 m$^2$/g, it may be difficult to form a fine wiring pattern on an insulating substrate. When the BET specific surface area value of the copper particles is more than 16.0 m$^2$/g, blisters or defects such as peel-off tend to be caused upon electroless metal plating.

When the BET specific surface area value (SSA) (m$^2$/g) and a carbon content (C) (% by weight) of the copper particles according to the present invention satisfy a relationship represented the following formula [1], the copper particles can exhibit a good suitability for plating so that it is possible to obtain a coating film having a high conductivity by a plating treatment:

$$C/SSA \cdot 7 \times 10^{-2} \qquad [1]$$

C/SSA is an index representing a content of carbon per unit surface area of a layer formed on a surface of the respective copper particles, specifically, an index representing a thickness of an organic material layer formed on a surface of the respective copper particles. When the thickness of the organic material layer exceeds a predetermined range owing to any change in surface conditions of the copper particles during the production process or with time, the surface activity of the copper particles tends to be suppressed, and the plating suitability of the copper particles tends to be deteriorated, so that it is not possible to obtain a conductive coating film having a high conductivity even by electroless metal plating. Also, it is not possible to obtain a conductive coating film having a high conductivity even by superheated steam treatment. The ratio C/SSA is preferably not more than $6.8 \times 10^{-2}$ and more preferably not more than $6.5 \times 10^{-2}$.

In addition, the carbon content in the copper particles is preferably not more than 0.50% by weight and more preferably not more than 0.40% by weight. The carbon layer formed on a surface of copper by the conventional ordinary method of physically or chemically adsorbing a compound having a good affinity to copper such as benzotriazole or derivatives thereof, an organic amine, a fatty acid and a metal alkoxide thereonto is physically or chemically strongly bonded to the surface of copper and therefore hardly fallen off therefrom in the copper paste, so that formation of an electroless plating layer on the copper powder-containing coating film and exhibition of a good conductivity of the coating film by superheated steam treatment tend to be inhibited. The copper particles with a less carbon content according to the present invention can be obtained, for example, by sufficiently washing and then drying the copper particles without physically or chemically adsorbing the compound having a good affinity to copper thereonto as conventionally conducted in the production process.

Further, when the BET specific surface area value (SSA) ($m^2/g$) and an oxygen content (O) (% by weight) of the copper particles according to the present invention satisfy a relationship represented by the following formula [2], it is possible to obtain a conductive coating film having a high conductivity. The lower limit of the ratio O/SSA is not particularly limited.

$$O/SSA \cdot 0.2 \quad [2]$$

O/SSA is an index representing a content of oxygen per unit surface area of a layer formed on a surface of the respective copper particles, specifically, an index representing a thickness of an oxide layer formed on a surface of the respective copper particles. When the thickness of the oxide layer on the surface of the respective copper particles exceeds a predetermined range, the surface activity of the copper particles tends to be suppressed, so that the copper particles hardly act as a starting point of plating. For this reason, it is sometimes not possible to obtain a conductive coating film having a high conductivity even by electroless metal plating. Also, when the thickness of the oxide layer on the surface of the respective copper particles exceeds a predetermined range, the surface activity of the copper particles tends to be suppressed, so that it is not possible to obtain a conductive coating film having a high conductivity even by superheated steam treatment. The copper particles tend to rapidly form an oxide layer as an outermost layer according to an oxygen partial pressure in an ambient atmosphere. Therefore, in order to maintain the ratio O/SSA of the copper particles at a level as low as possible, the copper particles may be handled in the conditions with a low oxygen partial pressure, or may be handled in a solution having a less amount of dissolved oxygen.

The content of oxygen in the copper particles is preferably not more than 1.00% by weight. An oxide layer tends to be rapidly formed as an outermost layer on the copper particles according to an oxygen partial pressure in an ambient atmosphere. Conventionally, in order to suppress formation and growth of an oxide layer on the surface of the respective copper particles, the copper particles have been subjected to the surface treatment in which a compound having a good affinity to copper is physically or chemically adsorbed thereonto. On the other hand, in the present invention, in order to maintain the ratio O/SSA of the copper particles at a level as low as possible, the copper particles may be handled in the conditions with a low oxygen partial pressure, or may be handled in a solution having a less amount of dissolved oxygen, whereby the oxygen content in the copper particles can be kept as low as possible.

When the carbon content and the oxygen content of the copper particles satisfy the above requirements, fusion of the copper particles is initiated at a temperature far lower than a melting point of a bulk copper, so that the copper particles can readily exhibit a good conductivity. When subjected to heat treatment with superheated steam, fusion of the copper particles can be initiated at a temperature far lower than a melting point of a bulk copper without being limited to so-called nanoparticles, and even though the copper particles are not necessarily nanoparticles having a size of not more than 100 nm, it is possible to obtain a conductive coating film having a high conductivity.

The copper paste used in the present invention is prepared by dispersing the copper particles and an organic binder as main components in a solvent. Further, a curing agent may be added to the copper paste, if required.

The solvent used in the copper paste according to the present invention may be selected from those solvents capable of dissolving a binder resin therein, and may be either an organic compound or water. The solvent serves not only for dispersing the copper particles in the copper paste, but also for controlling a viscosity of the resulting dispersion. Examples of the preferred organic solvent include alcohols, ethers, ketones, esters, aromatic hydrocarbons and amides.

Examples of the binder resin used in the copper paste according to the present invention include resins such as polyesters, polyurethanes, polycarbonates, polyethers, polyamides, polyamide imides, polyimides and acrylic resins, as well as copolymerized products or blended mixtures of these resins. Among these resins, preferred are those resins having an ester bond, a urethane bond, an amide bond, an ether bond, an imide bond or the like from the viewpoint of a good stability of the copper particles. In particular, the use of polyesters is more preferred in view of adhesion to the insulating substrate, resistance to an electroless plating solution, and adequate decomposability in the superheated steam treatment and reducing property of an oxide layer on the surface of copper owing to the decomposability.

The viscosity of the copper paste according to the present invention may be adjusted by controlling a ratio between the copper particles and the solvent therein. The content of the solvent in the copper paste is in the range of 10 to 400 parts by weight and preferably 20 to 400 parts by weight based on 100 based on 100 parts by weight of the copper particles.

In the case where the copper powder-containing coating film used in the present invention is subjected to metal plating, the ratio between the copper particles and the binder resin in the copper paste according to the present invention exerts influence on adhesion between the conductive coating film and the insulating substrate, deposition of metal on the copper powder-containing coating film and properties of the obtained plating film. The ratio between the copper particles and the binder resin in the copper paste is controlled such that the binder resin is used in an amount of 2 to 15 parts by weight, preferably 3 to 15 parts by weight and more preferably 5 to 12 parts by weight based on 100 parts by weight of the copper particles. When the binder resin is used in an amount of 2 to 15 parts by weight based on 100 parts by weight of the copper particles, the copper powder-containing coating film obtained by drying a coating film formed by using the copper paste has continuous voids therein. When subjecting such a copper powder-containing coating film to electroless metal plating, the plating solution is penetrated into the voids, so that metal ions are reduced and deposited around the copper particles as starting points. For this reason, even though the copper powder-containing coating film exhibits no conductivity before the plating treatment, the coating film can exhibit a good conductivity by subjecting it to the electroless metal plating. When the amount of the binder resin used is out of the above-specified range, i.e., when the binder resin is used in an amount of less than 2 parts by weight based on 100 parts by weight of the copper particles, the resulting coating film tends to be deteriorated in adhesion to the insulating substrate, and therefore tends to be readily peeled off upon the electroless plating. On the other hand, when the binder resin is used in an amount of more than 15 parts by weight based on 100 parts by weight of the copper particles, it may be difficult to penetrate the plating solution into the copper powder-containing coating film, so that a vapor generated upon the plating tends to be hardly removed from the copper powder-containing coating film. Therefore, it may be difficult to form the plating film, or blisters tend to occur thereon.

In the case where the copper powder-containing coating film used in the present invention is subjected to heat treatment with superheated steam, the ratio between the copper particles and the binder resin in the copper past according to the present invention also exerts influence on adhesion between the conductive coating film and the insulating substrate after the superheated steam treatment, and exhibition of a good conductivity of the coating film by the superheated steam treatment. The ratio between the copper particles and the binder resin in the copper paste is controlled such that the binder resin is used in an amount of 2 to 30 parts by weight, preferably 3 to 15 parts by weight and more preferably 5 to 12 parts by weight based on 100 parts by weight of the copper particles. When the amount of the binder resin used is out of the above-specified range, i.e., when the binder resin is used in an amount of less than 2 parts by weight based on 100 parts by weight of the copper particles, the resulting coating film tends to be deteriorated in adhesion to the insulating substrate. On the other hand, when the binder resin is used in an amount of more than 30 parts by weight based on 100 parts by weight of the copper particles, the copper particles tend to be hardly sintered upon the superheated steam treatment, so that it may be difficult to obtain a conductive coating film having a high conductivity.

In order to improve adhesion of the coating film to the insulating substrate, an anchor coat layer may be formed on the insulating substrate, and then the copper paste may be applied or printed on the anchor coat layer. As the anchor coat, there may be used those coats having a thickness of not more than 1 μm after dried, such as, for example, a copolyester resin/polyisocyanate cured coat, an acrylic resin cured coat, a polyamide imide resin cured coat, an epoxy resin cured coat and a phenol resin cured coat. When the amount of the binder resin in the copper paste is less than 5 parts by weight based on 100 parts by weight of the copper particles, the resulting coating film tends to be considerably deteriorated in adhesion to the insulating substrate.

The copper paste according to the present invention preferably comprises a curing agent. Examples of the curing agent that can be used in the present invention include a phenol resin, an amino resin, an isocyanate compound and an epoxy compound. In particular, a tri- or higher functional isocyanate compound, a blocked isocyanate compound or an epoxy compound is preferably used as the curing agent. The curing agent is preferably used in an amount of 1 to 50% by weight and more preferably 1 to 30% by weight based on the binder resin. If no curing agent is used in the copper paste, the peel-off between the insulating substrate and the copper powder-containing coating film tends to be caused upon the electroless plating or after the superheated steam treatment.

The copper paste according to the present invention may also comprise a polymer comprising a functional group having an absorptivity to metals such as a sulfonate group and a carboxylate group, and may further comprise a dispersant. Examples of the dispersant include higher fatty acids such as stearic acid, oleic acid and myristic acid, fatty acid amides, fatty acid metal salts, phosphoric acid esters and sulfonic acid esters. The dispersant may be used in an amount of 0.1 to 10% by weight based on the binder resin.

The copper paste may be produced by an ordinary method in which the particles are dispersed in a liquid. For example, the copper particles and a binder resin solution may be mixed, if required, together with an additional amount of a solvent, and the resulting mixture may be dispersed by an ultrasonic method, a mixer method, a three roll mill method, a ball mill method or the like. These dispersing methods may be used in combination of any two or more thereof. The dispersing treatment may be carried out at room temperature, or may be carried out under heating in order to reduce a viscosity of the dispersion.

The insulating substrate used in the present invention may be formed of either an organic material or an inorganic material. Examples of the material used for the insulating substrate include organic materials for flexible plastic substrates including polyesters such as polyethylene terephthalate (PET), polyethylene naphthalate and wholly aromatic hydrocarbons; polyolefins such as polyethylene (PE), polypropylene (PP), polystyrene and EVA; vinyl-based resins such as polyvinyl chloride and polyvinylidene chloride; as well as polyether ether ketone (PEEK), polysulfone (PSF), polyether sulfone (PES), polycarbonates (PC), polyamides, polyimides, acrylic resins and triacetyl cellulose (TAC); and inorganic materials such as glass and ceramic materials. Further, as the insulating substrate, there may also be used an insulating substrate having a crosslinked structure such as a heat-cured resin or a photo-crosslinked resin which is formed on a release film. In the present invention, in view of physical properties, heat resistance, easiness of handling and inexpensiveness, the insulating substrate is preferably formed of a polyethylene terephthalate film or a polyimide film.

The method of forming the conductive coating film on the insulating substrate by using the copper paste according to the present invention is explained below. Meanwhile, the conductive coating film may be provided over a whole surface of the insulating substrate, or may be in the form of a patterned film such as a conductive circuit. Further, the conductive coating film may be formed on one or both surfaces of the insulating substrate.

In order to form the copper powder-containing coating film on the insulating substrate by using the liquid copper paste, there may be used ordinary methods used for applying or printing the copper paste on the insulating substrate. For example, there may be used a screen printing method, a dip coating method, a spray coating method, a spin coating method, a roll coating method, a die coating method, an ink-jetting method, a letterpress printing method, an intaglio printing method, etc. By evaporating the solvent from the coating film formed by applying or printing the copper paste by heating, under reduced pressure or the like, it is possible to form the copper powder-containing coating film. In general, the copper powder-containing coating film obtained at the stage of evaporating the solvent has a specific resistance of not less than 1·cm, and not less than 10·cm in many cases, and therefore does not exhibit yet a sufficient conductivity required for conductive circuits.

The thickness of the conductive coating film according to the present invention may be appropriately determined according to necessary characteristics of the coating film such as electric resistance and adhesion property, and therefore is not particularly limited. The thickness of the formable conductive coating film may vary depending upon composition of the dispersion and coating and printing methods used, and is preferably 0.05 to 30 μm, more preferably 0.1 to 20 μm and still more preferably 0.2 to 10 μm. In order to obtain a thick conductive coating film, it is necessary to increase a thickness of a coating layer applied. Therefore, there tend to occur the problems such as defects owing to residual solvents and deterioration in economy owing to reduction in speed of forming the coating film. On the other hand, when the thickness of the coating film is excessively small, there is such a tendency that formation of pinholes in the coating film becomes remarkable.

In the present invention, the copper powder-containing conductive paste is applied onto the insulating substrate to form the copper powder-containing coating film thereon, and then the resulting copper powder-containing coating film is treated with superheated steam to thereby form a copper coating film having a high conductivity.

The superheated steam means such a steam as obtained by further heating saturated steam to a still higher temperature without increasing a pressure. When the temperature of the superheated steam is not lower than 150° C., a radiation heat energy of the superheated steam is considerably increased as compared to an ordinary heated air, so that it is possible to heat a substance only for a short period of time.

The temperature of the superheated steam used in the present invention is not lower than 150° C., and preferably not lower than 200° C. The upper limit of the temperature of the superheated steam is not higher than 500° C. The upper limit of the temperature of the superheated steam is limited by a heat resistance of the insulating substrate used. When the insulating substrate is formed of an organic polymer, the upper limit of the temperature of the superheated steam is more preferably not higher than 400° C. and still more preferably not higher than 350° C. The heating time by the superheated steam may also be determined according to amount and characteristics of the material to be treated with the superheated steam, and is preferably 10 sec to 30 min. When the temperature of the superheated steam is excessively low, it is not possible to obtain a conductive coating film having a high conductivity. When the temperature of the superheated steam is excessively high, a substantially whole amount or a whole amount of the binder resin is removed from the coating film, so that adhesion between the conductive coating film and the substrate tends to be deteriorated, and the substrate by itself tends to be damaged severely. In particular, when using an insulating substrate formed of an organic material, the temperature of the superheated steam is preferably not higher than 400° C.

The procedure for the heat treatment with superheated steam may be carried out in the same manner as used in the heat treatment with heated air, i.e., in hot-air drying. When air is completely replaced with superheated steam, an oxygen-free state similar to an inert gas is attained, so that it is possible to prevent occurrence of oxidation reaction. Further, when the surface conditions of the copper particles satisfy the requirements of the present invention, the copper particles undergo a reduction reaction owing to improved surface activity thereof, so that it is recognized that the copper particles are remarkably improved in conductivity. Thus, it is considered that the oxide layer formed on the surface of the respective copper particles are subjected to reducing reaction. In the case where metal fine particles that are likely to form an oxide layer, such as copper particles, are used, when the surface of the coating film is patterned by dividing it into a superheated steam-treated portion and a superheated steam-untreated portion, it is possible to form a pattern having a conductive portion and an insulating portion on the same plane.

In the superheated steam treatment, whether the conductive coating film can be readily produced or not depends upon the surface conditions of the copper particles. The present invention has been accomplished by clearly determining the surface conditions of the copper particles having a high conductivity which can be produced by the superheated steam treatment.

In addition, when the thus formed copper powder-containing coating film is subjected to electroless metal plating, it is possible to produce the conductive coating film. As the metal coating film formed by the electroless metal plating, there may be mentioned a coating film of copper, nickel, gold, immersion tin, silver, etc. In the present invention, as the electroless metal plating, there may be used an immersion plating method utilizing ionization series of metal ions, and a chemical reduction plating method for forming a metal coating film by the action of a reducing agent in the presence of a complexing agent. The latter chemical reduction plating method is generally called an electroless plating. Among these plating methods, the chemical reduction plating method is preferably used in view of properties of the obtained plating coating film and adhesion to the insulating substrate. In the process for producing the conductive coating film according to the present invention, it is not necessary to subject a material to be plated to an activation treatment with palladium or tin as generally used in conventional electroless metal plating methods. In addition, it is not necessarily required to chemically etch a surface of the substrate unlike plastic plating.

In the electroless plating, after forming the copper powder-containing coating film on the insulating substrate, the coating film is immersed in an electroless plating solution comprising aimed metal ions to be plated. In the electroless copper plating, formaldehyde is generally used as a reducing agent. Formaldehyde can exhibit a strong reducing power when a pH value of the plating solution is not less than 12 and a plating bath temperature is not lower than 50° C. A high-speed type electroless copper plating using formaldehyde is generally carried out in the presence of a strong alkali and under high-temperature conditions. After the electroless copper plating, two or more kinds of metals such as nickel may be plated and laminated on the electroless copper plating layer.

In general, the electroless plating requires a prolonged period of time as compared to electroplating to form a metal layer having the same thickness. The electroless plating may be followed by electroplating to increase a thickness of the metal layer for a short period of time.

EXAMPLES

The present invention is described in more detail by the following Examples. However, these Examples are only illustrative and therefore not intended to limit the invention thereto. Various properties described in Examples and Comparative Examples were measured by the following methods.

Specific Resistance:

The specific resistance was determined from a surface resistivity and a thickness as measured using a low resistivity meter "LORESTA GP" and a probe "ASP" manufactured by Mitsubishi Chemical Corp.

Average Particle Diameter:

The average particle diameter was determined as an average value of particle diameters of 100 particles on an SEM micrograph observed using a scanning electron microscope "S-4800" manufactured by Hitachi High-Technologies Corp.

BET Specific Surface Area Value (SSA) ($m^2/g$):

The BET specific surface area value was measured by a measuring device "Monosorb MS-11" manufactured by QUANTA CHROM Corp.

Carbon Content (C) (% by Weight):

The amount of carbon was measured using a Horiba metal-carbon/sulfur analyzer "EMIA-2200 Model" manufactured by Horiba Seisakusho Co., Ltd.

Oxygen Content (O) (% by Weight):

The oxygen content was calculated from weight loss by reducing reaction as measured at a temperature of 250 to 550° C. in a 2% hydrogen-nitrogen atmosphere using a thermogravimetry/differential thermal analysis device "TG-DTA6300" manufactured by Seiko Instruments Inc.

Adhesion Property:

A cellophane tape was laminated onto the plated surface and rapidly peeled off therefrom. The evaluation was conducted based on the following ratings.

A—No peeling nor breakage of the conductive coating film occurred.

B—Peeling or breakage of the conductive coating film was recognized, but was less than 10% of a laminated portion of the cellophane tape.

C—Peeling or breakage of the conductive coating film was recognized, and was not less than 10% of a laminated portion of the cellophane tape.

Appearance of Plating:

After the electroless plating, the resulting plating layer was washed with water and immediately observed by naked eyes.

The production methods of the copper particles 1 to 12 conducted in the following Examples and Comparative Examples are described below. Also, the average particle diameter (μm), BET specific surface area value (SSA) ($m^2/g$), carbon content (C) (% by weight), oxygen content (O) (% by weight) and C/SSA of each of the copper particles 1 to 12 are shown in Table 1-1.

Example 1-1

Copper Particles 1

One hundred grams of copper sulfate pentahydrate and 3 g of L-arginine were dissolved in 600 mL of water while stirring and heating, and a 10N sodium hydroxide solution was added at 60° C. to the resulting solution until reaching a pH value of 10.5. Next, 36 g of D-glucose were added to the solution and reacted therewith for 60 min while stirring to obtain a copper suboxide slurry. Then, after the obtained slurry was cooled to a liquid temperature of 50° C., 39 mL of hydrazine monohydrate were added thereto, and the resulting reaction mixture was heated to 70° C. and held at 70° C. for 60 min, thereby obtaining a copper slurry. The resulting copper slurry was filtered to separate a cake therefrom, and the obtained cake was washed with water and then washed and dehydrated with methanol. The thus obtained cake was vacuum-dried at 40° C. under an oxygen partial pressure of not more than 0.2 kPa for 3 hr, and thereafter the obtained dried product was sealed together with an oxygen absorber and stored at an oxygen concentration of not more than 0.1%.

Example 1-2

Copper Particles 2

One hundred grams of copper sulfate pentahydrate and 3 g of dimethyl glyoxime were dissolved in 600 mL of water while stirring and heating, and a 10N sodium hydroxide solution was added at 60° C. to the resulting solution until reaching a pH value of 11.5. Next, 36 g of D-glucose were added to the solution and reacted therewith for 60 min while stirring to obtain a copper suboxide slurry. Then, after the obtained slurry was cooled to a liquid temperature of 50° C., 39 mL of hydrazine monohydrate were added thereto, and the resulting reaction mixture was heated to 70° C. and held at 70° C. for 60 min, thereby obtaining a copper slurry. The resulting copper slurry was filtered to separate a cake therefrom, and the obtained cake was washed with water and then washed and dehydrated with methanol. The thus obtained cake was vacuum-dried at 40° C. under an oxygen partial pressure of not more than 0.2 kPa for 3 hr, and thereafter the obtained dried product was sealed together with an oxygen absorber and stored at an oxygen concentration of not more than 0.1%.

Example 1-3

Copper Particles 3

One hundred grams of copper sulfate pentahydrate and 3 g of glycine were dissolved in 600 mL of water while stirring and heating, and a 10N sodium hydroxide solution was added at 60° C. to the resulting solution until reaching a pH value of 11.5. Next, 36 g of D-glucose were added to the solution and reacted therewith for 60 min while stirring to obtain a copper suboxide slurry. Then, after the obtained slurry was cooled to a liquid temperature of 50° C., 0.02 g of sodium hydrogen borate was added thereto, and the resulting slurry was held for 10 min. Then, 39 mL of hydrazine monohydrate were added to the slurry, and the resulting reaction mixture was heated to 70° C. and held at 70° C. for 60 min, thereby obtaining a copper slurry. The resulting copper slurry was filtered to separate a cake therefrom, and the obtained cake was washed with water and then washed and dehydrated with methanol. The thus obtained cake was vacuum-dried at 40° C. under an oxygen partial pressure of not more than 0.2 kPa for 3 hr, and thereafter the obtained dried product was sealed together with an oxygen absorber and stored at an oxygen concentration of not more than 0.1%.

Example 1-4

Copper Particles 4

One hundred grams of copper sulfate pentahydrate and 3 g of L-arginine were dissolved in 600 mL of water while stirring and heating, and a 10N sodium hydroxide solution was added at 60° C. to the resulting solution until reaching a pH value of 10.5. Next, 36 g of D-glucose were added to the solution and reacted therewith for 30 min while stirring to obtain a copper suboxide slurry. Then, after the obtained slurry was cooled to a liquid temperature of 50° C., 60 g of ascorbic acid were added thereto, and the resulting reaction mixture was heated to 80° C. and held at 80° C. for 60 min, thereby obtaining a copper slurry. The resulting copper slurry was filtered to separate a cake therefrom, and the obtained cake was washed with water and then washed and dehydrated with methanol. The thus obtained cake was vacuum-dried at 40° C. under an oxygen partial pressure of not more than 0.2 kPa for 3 hr, and thereafter the obtained dried product was sealed together with an oxygen absorber and stored at an oxygen concentration of not more than 0.1%.

Example 1-5

Copper Particles 5

One hundred grams of copper sulfate pentahydrate and 3 g of glycine were dissolved in 600 mL of water while stirring and heating, and a 10N sodium hydroxide solution was added at 60° C. to the resulting solution until reaching a pH value of 11.5. Next, 36 g of D-glucose were added to the solution and reacted therewith for 60 min while stirring to obtain a copper suboxide slurry. Then, after the obtained slurry was cooled to a liquid temperature of 50° C., 39 mL of hydrazine monohydrate were added thereto, and the resulting reaction mixture was heated to 70° C. and held at 70° C. for 60 min, thereby obtaining a copper slurry. The resulting copper slurry was filtered to separate a cake therefrom, and the obtained cake was washed with water and then washed and dehydrated with methanol. The thus obtained cake was vacuum-dried at 40° C. under an oxygen partial pressure of not more than 0.2 kPa for 3 hr, and thereafter the obtained dried product was sealed together with an oxygen absorber and stored at an oxygen concentration of not more than 0.1%.

Example 1-6

Copper Particles 6

One hundred grams of copper sulfate pentahydrate and 3 g of L-arginine were dissolved in 600 mL of water while stirring and heating, and a 10N sodium hydroxide solution was added at 60° C. to the resulting solution until reaching a pH value of 10.5. Next, 36 g of D-glucose were added to the solution and reacted therewith for 30 min while stirring to obtain a copper suboxide slurry. Then, after the obtained slurry was cooled to a liquid temperature of 50° C., 60 g of ascorbic acid were added thereto, and the resulting reaction mixture was heated to 80° C. and held at 80° C. for 60 min, thereby obtaining a copper slurry. The resulting copper slurry was filtered to separate a cake therefrom, and the obtained cake was washed with water and then washed and dehydrated with methanol. The thus obtained cake was vacuum-dried at 40° C. under an oxygen partial pressure of not more than 0.2 kPa for 8 hr, and thereafter the obtained copper particles were stored in a desiccator for one week and then subjected to tests.

Example 1-7

Copper Particles 7

One hundred grams of copper sulfate pentahydrate and 3 g of L-arginine were dissolved in 600 mL of water while stirring and heating, and a 10N sodium hydroxide solution was added at 60° C. to the resulting solution until reaching a pH value of 10.5. Next, 36 g of D-glucose were added to the solution and reacted therewith for 60 min while stirring to obtain a copper suboxide slurry. Then, after the obtained slurry was cooled to a liquid temperature of 50° C., 39 mL of hydrazine monohydrate were added thereto, and the resulting reaction mixture was heated to 70° C. and held at 70° C. for 60 min, thereby obtaining a copper slurry. The resulting copper slurry was filtered to separate a cake therefrom, and the obtained cake was washed with water and then washed and dehydrated with methanol. The thus obtained cake was vacuum-dried at 40° C. under an oxygen partial pressure of not more than 0.2 kPa for 3 hr, and thereafter the obtained copper particles were stored in a desiccator for one week and then subjected to tests.

Example 1-8

Copper Particles 8

One hundred grams of copper sulfate pentahydrate and 3 g of dimethyl glyoxime were dissolved in 600 mL of water while stirring and heating, and a 10N sodium hydroxide solution was added at 60° C. to the resulting solution until reaching a pH value of 11.5. Next, 36 g of D-glucose were added to the solution and reacted therewith for 60 min while stirring to obtain a copper suboxide slurry. Then, after the obtained slurry was cooled to a liquid temperature of 50° C., 39 mL of hydrazine monohydrate were added thereto, and the resulting reaction mixture was heated to 70° C. and held at 70° C. for 60 min, thereby obtaining a copper slurry. The resulting copper slurry was filtered to separate a cake therefrom, and the obtained cake was washed with water and then washed and dehydrated with methanol. The thus obtained cake was dried at 40° C. using a hot-air dryer for 8 hr, and thereafter the obtained dried product was sealed together with an oxygen absorber and stored at an oxygen concentration of not more than 0.1%.

Comparative Example 1-1

Copper Particles 9

One hundred grams of copper sulfate pentahydrate and 3 g of L-arginine were dissolved in 600 mL of water while stirring and heating, and a 10N sodium hydroxide solution was added at 60° C. to the resulting solution until reaching a pH value of 10.5. Next, 36 g of D-glucose were added to the solution and reacted therewith for 60 min while stirring to obtain a copper suboxide slurry. Then, after the obtained slurry was cooled to a liquid temperature of 50° C., 39 mL of hydrazine monohydrate were added thereto, and the resulting reaction mixture was heated to 70° C. and held at 70° C. for 60 min, thereby obtaining a copper slurry. The resulting copper slurry was filtered to separate a cake therefrom, and the obtained cake was washed with water and then washed and dehydrated with methanol. The thus obtained cake was repulped in 100 mL of methanol, and then 0.5 g of benzotriazole was added to the resulting solution, followed by stirring for 30 min. The resulting surface-treated copper slurry was filtered to separate a cake therefrom, and the obtained cake was dried at 40° C. under an oxygen partial pressure of not more than 0.2 kPa for 3 hr, and thereafter the obtained dried product was sealed together with an oxygen absorber and stored at an oxygen concentration of not more than 0.1%.

Comparative Example 1-2

Copper Particles 10

One hundred grams of copper sulfate pentahydrate and 3 g of L-arginine were dissolved in 600 mL of water while stirring and heating, and a 10N sodium hydroxide solution was added at 60° C. to the resulting solution until reaching a pH value of 10.5. Next, 36 g of D-glucose were added to the solution and reacted therewith for 60 min while stirring to obtain a copper suboxide slurry. Then, after the obtained slurry was cooled to a liquid temperature of 50° C., 39 mL of hydrazine monohydrate were added thereto, and the resulting reaction mixture was heated to 70° C. and held at 70° C. for 60 min, thereby obtaining a copper slurry. The resulting copper slurry was filtered to separate a cake therefrom, and the obtained cake was washed with water and then washed and dehydrated with methanol. The thus obtained cake was repulped in 100 mL of methanol, and then 0.5 g of oleic acid was added to the resulting solution, followed by stirring for 30 min. The resulting surface-treated copper slurry was filtered to separate a cake therefrom, and the obtained cake was dried at 40° C. under an oxygen partial pressure of not more than 0.2 kPa for 3 hr, and thereafter the obtained dried product was sealed together with an oxygen absorber and stored at an oxygen concentration of not more than 0.1%.

Comparative Example 1-3

Copper Particles 11

Copper particles "1020Y" produced by Mitsui Mining & Smelting Co., Ltd., were used as such.

Comparative Example 1-4

Copper Particles 12

Fifteen grams of L-sodium tartarate were added to a suspension comprising 143 g of copper suboxide having an average particle diameter of 3 μm and 2000 cc of water, and the temperature in the reaction system was raised to 70° C. Then, 200 g of L-ascorbic acid were added to the reaction solution, and the resulting reaction mixture was held at 70° C. for 2 hr, thereby obtaining a copper slurry. The resulting copper slurry was filtered to separate a cake therefrom, and the obtained cake was washed with water and then washed and dehydrated with methanol. The thus obtained cake was vacuum-dried at 40° C. under an oxygen partial pressure of not more than 0.2 kPa for 3 hr, and thereafter the obtained dried product was sealed together with an oxygen absorber and stored at an oxygen concentration of not more than 0.1%.

TABLE 1-1

| | | Average particle diameter (μm) | BET specific surface area value (m$^2$/g) | Carbon content (wt %) |
|---|---|---|---|---|
| Example 1-1 | Copper particles-1 | 0.11 | 6.1 | 0.23 |
| Example 1-2 | Copper particles-2 | 0.13 | 5.4 | 0.20 |
| Example 1-3 | Copper particles-3 | 0.28 | 2.5 | 0.11 |
| Example 1-4 | Copper particles-4 | 0.19 | 4.0 | 0.24 |
| Example 1-5 | Copper particles-5 | 0.35 | 1.7 | 0.11 |
| Example 1-6 | Copper particles-6 | 0.19 | 4.0 | 0.24 |
| Example 1-7 | Copper particles-7 | 0.11 | 6.5 | 0.23 |
| Example 1-8 | Copper particles-8 | 0.14 | 5.1 | 0.20 |
| Comparative Example 1-1 | Copper particles-9 | 0.10 | 6.5 | 0.52 |
| Comparative Example 1-2 | Copper particles-10 | 0.10 | 6.7 | 0.58 |
| Comparative Example 1-3 | Copper particles-11 | 0.30 | 2.7 | 0.26 |
| Comparative Example 1-4 | Copper particles-12 | 3.5 | 0.22 | 0.012 |

| | | Oxygen content (wt %) | C/SSA (—) | O/SSA (—) |
|---|---|---|---|---|
| Example 1-1 | Copper particles-1 | 0.98 | $3.8 \times 10^{-2}$ | 0.16 |
| Example 1-2 | Copper particles-2 | 0.74 | $3.7 \times 10^{-2}$ | 0.14 |
| Example 1-3 | Copper particles-3 | 0.23 | $4.4 \times 10^{-2}$ | 0.09 |
| Example 1-4 | Copper particles-4 | 0.56 | $6.0 \times 10^{-2}$ | 0.14 |
| Example 1-5 | Copper particles-5 | 0.18 | $6.5 \times 10^{-2}$ | 0.11 |
| Example 1-6 | Copper particles-6 | 1.02 | $6.0 \times 10^{-2}$ | 0.26 |
| Example 1-7 | Copper particles-7 | 1.72 | $3.5 \times 10^{-2}$ | 0.26 |
| Example 1-8 | Copper particles-8 | 1.52 | $3.9 \times 10^{-2}$ | 0.30 |
| Comparative Example 1-1 | Copper particles-9 | 0.74 | $8.0 \times 10^{-2}$ | 0.11 |
| Comparative Example 1-2 | Copper particles-10 | 0.55 | $8.7 \times 10^{-2}$ | 0.08 |
| Comparative Example 1-3 | Copper particles-11 | 0.35 | $9.6 \times 10^{-2}$ | 0.13 |
| Comparative Example 1-4 | Copper particles-12 | 0.03 | $5.5 \times 10^{-2}$ | 0.14 |

Next, the copper pastes obtained in the respective Examples and Comparative Examples and the process for producing the conductive coating films are described below. The formulations or compositions of the respective copper pastes as well as the evaluation results of the conductive coating films are shown in Table 1-2.

Example 1-9

The composition with the following formulation was charged into a sand mill, and dispersed at 800 rpm for 2 hr. As dispersing media, there were used zirconia beads having a radius of 0.1 mm. The obtained copper paste was applied onto a 25 μm-thick biaxially stretched polyester film using an applicator such that the thickness of the coating film obtained after dried was 2 μm, and then subjected to hot-air drying at 120° C. for 5 min, thereby obtaining a copper powder-containing coating film.

Composition of Dispersion

| | |
|---|---|
| Copolyester solution (in the form of a 40% by weight solution in toluene/cyclohexanone = 1/1 (weight ratio)) | 2.5 g |
| Copper particles 1 | 9 g |
| γ-Butyrolactone (diluent) | 3.5 g |
| Methyl ethyl ketone (diluent) | 5 g |
| Blocked isocyanate | 0.1 g |

(in which copolyester: "VYLON 300" produced by Toyobo Co., Ltd.; blocked isocyanate: "CORONATE 2546" produced by Nippon Polyurethane Industry Co., Ltd.)

The resulting polyester film with the coating film was immersed in an electroless copper plating bath having the following composition. The electroless copper plating was carried out at a plating bath temperature of 55° C. for an immersion time of 10 min by controlling a pH value of the bath to 12.5 using sodium hydroxide. The polyester film with the coating film was withdrawn from the plating bath, washed with water and then dried. As a result of the measurement using a thickness meter, it was confirmed that a plating layer having a thickness of 1 μm was formed on the resulting conductive coating film, and the specific resistance of the conductive coating film was 3.5μ·cm. The adhesion property of the conductive coating film and the appearance of the plating layer were evaluated. The evaluation results of the resulting conductive coating film are shown in Table 1-2.

Electroless Copper Plating Bath:

| Copper sulfate pentahydrate | 3.8 g |
| Ethylenediaminetetraacetic acid | 35 g |
| Formalin (37% formaldehyde aqueous solution) | 8.1 g |
| Water | 500 g |

Examples 1-10 to 1-16

The same procedure as in Example 1-9 was conducted except that only the copper particles were changed as shown in Table 1-2, thereby obtaining conductive coating films. The thus obtained conductive coating films were evaluated in the same manner as in Example 1-9. The evaluation results are shown in Table 1-2.

Examples 1-17 and 1-18

The same procedure as in Example 1-9 was conducted except that the ratio between the copper particles, binder resin and curing agent was changed as shown in Table 1-2, thereby obtaining conductive coating films. The thus obtained conductive coating films were evaluated in the same manner as in Example 1-9. The evaluation results are shown in Table 1-2.

Example 1-19

The composition with the following formulation was charged into a sand mill, and dispersed at 800 rpm for 2 hr. As dispersing media, there were used zirconia beads having a radius of 0.1 mm. The obtained copper paste was applied onto a 25 μm-thick polyimide film using an applicator such that the thickness of the coating film obtained after dried was 2 μm, and then subjected to hot-air drying at 150° C. for 5 min, thereby obtaining a copper powder-containing coating film.

Composition of Dispersion

| Polyurethane solution | 2.5 g |
| (in the form of a 40% by weight solution in toluene/methyl ethyl ketone = 18/82 (weight ratio)) | |
| Copper particles 3 | 9 g |
| γ-Butyrolactone (diluent) | 3.5 g |
| Methyl ethyl ketone (diluent) | 5 g |
| Epoxy resin | 0.2 g |
| Curing catalyst (triphenyl phosphine) | 0.05 g |

(in which polyurethane: "UR3500" produced by Toyobo Co., Ltd.; epoxy resin: cresol novolak type epoxy resin "EPICLON N-665" produced by DIC Corp.)

The resulting polyimide film with the coating film was immersed in an electroless nickel plating bath having the following composition. The electroless nickel plating was carried out at a plating bath temperature of 50° C. for an immersion time of 15 min by controlling a pH value of the bath to 8 using ammonia. The polyimide film with the coating film was withdrawn from the plating bath, washed with water and then dried. As a result, it was confirmed that a plating layer having a thickness of 1 μm was formed on the resulting conductive coating film, the specific resistance of the conductive coating film was 55μ·cm, and the adhesion property of the conductive coating film and the appearance of the plating layer were good. The evaluation results of the resulting conductive coating film are shown in Table 1-2.

Electroless Nickel Plating Bath:

| Nickel sulfate | 20 g |
| Sodium hypophosphite | 15 g |
| Ammonium citrate | 30 g |
| Water | 1000 g |

Comparative Examples 1-5 to 1-8

The same procedure as in Example 1-9 was conducted except that only the copper particles were changed as shown in Table 1-2, thereby obtaining conductive coating films. The copper powder-containing coating film formed from the copper paste obtained in Comparative Example 1-9 suffered from occurrence of a large number of pinholes, and the pinholes were not cancelled and repaired even by forming a plating coating film thereon. The evaluation results are shown in Table 1-2.

TABLE 1-2

|  | Examples | | | | |
|---|---|---|---|---|---|
|  | 1-9 | 1-10 | 1-11 | 1-12 | 1-13 |
| Copper paste | | | | | |
| Binder | | | | | |
| Copolyester | 1 | 1 | 1 | 1 | 1 |
| Copper particles | | | | | |
| Copper particles-1 | 9 | | | | |
| Copper particles-2 | | 9 | | | |
| Copper particles-3 | | | 9 | | |
| Copper particles-4 | | | | 9 | |
| Copper particles-5 | | | | | 9 |
| Copper particles-6 | | | | | |
| Copper particles-7 | | | | | |
| Copper particles-8 | | | | | |
| Copper particles-9 | | | | | |
| Copper particles-10 | | | | | |
| Copper particles-11 | | | | | |
| Copper particles-12 | | | | | |
| Curing agent | | | | | |
| Blocked isocyanate | 0.1 | 0.1 | 0.1 | 0.1 | 0.1 |
| Specific resistance before plating (·cm) | •10 | •10 | •10 | •10 | •10 |
| Metal species for plating | Cu | Cu | Cu | Cu | Cu |

TABLE 1-2-continued

| | 1-9 | 1-10 | 1-11 | 1-12 | 1-13 |
|---|---|---|---|---|---|
| After plating | | | | | |
| Appearance of plating layer | Good | Good | Good | Good | Good |
| Specific resistance (μ·cm) | 3.5 | 3.1 | 2.4 | 2.4 | 2.2 |
| Adhesion property | A | A | A | A | A |

| | Examples | | | | |
|---|---|---|---|---|---|
| | 1-14 | 1-15 | 1-16 | 1-17 | 1-18 |
| Copper paste Binder | | | | | |
| Copolyester | 1 | 1 | 1 | 0.5 | 1.2 |
| Copper particles | | | | | |
| Copper particles-1 | | | | | |
| Copper particles-2 | | | | | |
| Copper particles-3 | | | | 9.5 | 8.8 |
| Copper particles-4 | | | | | |
| Copper particles-5 | | | | | |
| Copper particles-6 | 9 | | | | |
| Copper particles-7 | | 9 | | | |
| Copper particles-8 | | | 9 | | |
| Copper particles-9 | | | | | |
| Copper particles-10 | | | | | |
| Copper particles-11 | | | | | |
| Copper particles-12 | | | | | |
| Curing agent | | | | | |
| Blocked isocyanate | 0.1 | 0.1 | 0.1 | 0.1 | 0.2 |
| Specific resistance before plating (•·cm) | •10 | •10 | •10 | •10 | •10 |
| Metal species for plating | Cu | Cu | Cu | Cu | Cu |
| After plating | | | | | |
| Appearance of plating layer | Good | Good | Good | Good | Good |
| Specific resistance (μ·cm) | 4.7 | 6.6 | 6.2 | 1.8 | 12 |
| Adhesion property | A | A | A | B | A |

| | Example | Comparative Examples | | | |
|---|---|---|---|---|---|
| | 1-19 | 1-5 | 1-6 | 1-7 | 1-8 |
| Copper paste Binder | | | | | |
| Copolyester | 1 | 1 | 1 | 1 | 1 |
| Copper particles | | | | | |
| Copper particles-1 | | | | | |
| Copper particles-2 | | | | | |
| Copper particles-3 | 9 | | | | |
| Copper particles-4 | | | | | |
| Copper particles-5 | | | | | |
| Copper particles-6 | | | | | |
| Copper particles-7 | | | | | |
| Copper particles-8 | | | | | |
| Copper particles-9 | | 9 | | | |
| Copper particles-10 | | | 9 | | |
| Copper particles-11 | | | | 9 | |
| Copper particles-12 | | | | | 9 |
| Curing agent | | | | | |
| Blocked isocyanate | 0.1 | 0.1 | 0.1 | 0.1 | 0.1 |
| Specific resistance before plating (•·cm) | •10 | •10 | •10 | •10 | •10 |
| Metal species for plating | Ni | Cu | Cu | Cu | Cu |
| After plating | | | | | |
| Appearance of plating layer | Good | *1 | *1 | *1 | *2 |
| Specific resistance (μ·cm) | 55 | 6.3 | 7.2 | 6.5 | 88 |
| Adhesion property | A | C | C | C | A |

Note
*1: Blisters occurred;
*2: A large number of pinholes were formed

Example 2-1

The composition with the following formulation was charged into a sand mill, and dispersed at 800 rpm for 2 hr. As dispersing media, there were used zirconia beads having a radius of 0.2 mm. The obtained copper paste was applied onto a 25 μm-thick polyimide film using an applicator such that the thickness of the coating film obtained after dried was 2 μm, and then subjected to hot-air drying at 120° C. for 5 min, thereby obtaining a copper powder-containing coating film.

Composition of Dispersion

| | |
|---|---|
| Copolyester solution (in the form of a 40% by weight solution in toluene/cyclohexanone = 1/1 (weight ratio)) | 2.5 parts |
| Copper particles 1 | 9 parts |
| γ-Butyrolactone (diluent) | 3.5 parts |
| Methyl ethyl ketone (diluent) | 5 parts |
| Blocked isocyanate | 0.2 part |

(in which copolyester: "VYLON 300" produced by Toyobo Co., Ltd.; blocked isocyanate: "CORONATE 2546" produced by Nippon Polyurethane Industry Co., Ltd.)

The resulting copper powder-containing coating film was heat-treated with superheated steam at 350° C. for 5 min. The above treatment was carried out by using a vapor heating apparatus "DHF Super-Hi10" manufactured by Dai-Ichi High Frequency Co., Ltd., as an apparatus for generating superheated steam, and supplying the superheated steam generated therein to a heat treatment furnace at a rate of 12 kg/hr. The specific resistance of the resulting conductive coating film is shown in Table 2-1. In addition, the same heat treatment with superheated steam as described above was conducted except that the superheated steam temperature was changed to 320° C. The evaluation result is also shown in Table 2-1.

Examples 2-2 to 2-8

The same procedure as in Example 2-1 was conducted except that only the copper particles were changed as shown in Table 2-1, thereby obtaining conductive coating films. The specific resistance of each of the thus obtained conductive coating films was evaluated in the same manner as in Example 2-1. The results are shown in Table 2-1. In addition, in FIG. 1, there is shown an SEM micrograph of the conductive coating film obtained in Example 2-3. Thus, it was confirmed that the copper particles in the conductive coating film obtained in Example 2-3 were sintered together.

In the respective Examples, it was possible to reduce a specific resistance of the conductive coating film to not more than 500μ·cm when subjected to superheated steam treatment at 350° C. In particular, in Examples 2-1 to 2-5, it was confirmed that the resulting conductive coating films had a specific resistance of not more than 100μ·cm and therefore were more excellent in conductivity. In addition, even when subjected to superheated steam treatment at a low temperature of 320° C., the conductive coating films had a specific resistance of not more than 8000μ·cm, in particular, in Examples 2-1 to 2-5, it was confirmed that the conductive coating films had a specific resistance of not more than 200μ·cm.

Comparative Examples 2-1 to 2-3

Figure 2:
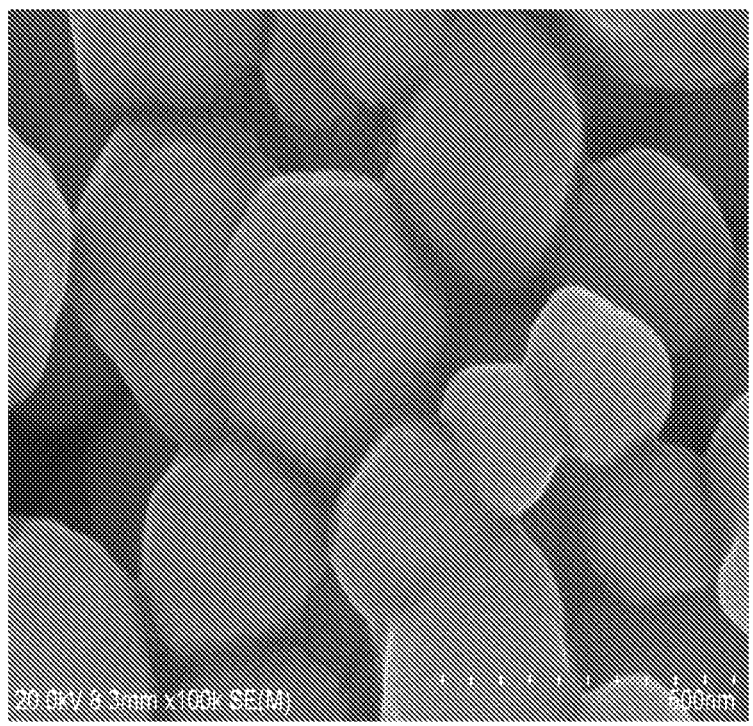
FIG. 2 is an SEM micrograph of a conductive coating film obtained in Comparative Example 2-5.

The same procedure as in Example 2-1 was conducted except that only the copper particles were changed as shown in Table 2-1, thereby obtaining conductive coating films. The specific resistance of each of the thus obtained conductive coating films was evaluated in the same manner as in Example 2-1. The results are shown in Table 2-1. In FIG. 2, there is shown an SEM micrograph of the conductive coating film obtained in Comparative Example 2-1. Thus, it was confirmed that the conductive coating film obtained in Comparative Example 2-1 was sintered merely insufficiently.

TABLE 2-1

|  | Examples | | | |
| --- | --- | --- | --- | --- |
|  | 2-1 | 2-2 | 2-3 | 2-4 |
| Metal powder-containing layer Binder | | | | |
| Copolyester | 1 | 1 | 1 | 1 |
| Copper particles | | | | |
| Copper particles-1 | 9 | | | |
| Copper particles-2 | | 9 | | |
| Copper particles-3 | | | 9 | |
| Copper particles-4 | | | | 9 |
| Copper particles-5 | | | | |
| Copper particles-6 | | | | |
| Copper particles-7 | | | | |
| Copper particles-8 | | | | |
| Copper particles-9 | | | | |
| Copper particles-10 | | | | |
| Copper particles-11 | | | | |
| Curing agent | | | | |
| Blocked isocyanate | 0.1 | 0.1 | 0.1 | 0.1 |
| Before heat treatment | | | | |
| Specific resistance (μ·cm) Superheated steam treatment (350° C. × 5 min) | •$10^4$ | •$10^4$ | •$10^4$ | •$10^4$ |
| Specific resistance (μ·cm) Superheated steam treatment (320° C. × 5 min) | 34.5 | 28.8 | 60 | 33 |
| Specific resistance (μ·cm) | 84 | 66 | 126 | 60 |

|  | Examples | | | |
| --- | --- | --- | --- | --- |
|  | 2-5 | 2-6 | 2-7 | 2-8 |
| Metal powder-containing layer Binder | | | | |
| Copolyester | 1 | 1 | 1 | 1 |
| Copper particles | | | | |
| Copper particles-1 | | | | |
| Copper particles-2 | | | | |
| Copper particles-3 | | | | |
| Copper particles-4 | | | | |
| Copper particles-5 | 9 | | | |
| Copper particles-6 | | 9 | | |
| Copper particles-7 | | | 9 | |
| Copper particles-8 | | | | 9 |
| Copper particles-9 | | | | |
| Copper particles-10 | | | | |
| Copper particles-11 | | | | |
| Curing agent | | | | |
| Blocked isocyanate Before heat treatment | 0.1 | 0.1 | 0.1 | 0.1 |
| Specific resistance (μ·cm) Superheated steam treatment (350° C. × 5 min) | •$10^4$ | •$10^4$ | •$10^4$ | •$10^4$ |
| Specific resistance (μ·cm) Superheated steam treatment (320° C. × 5 min) | 48 | 342 | 216 | 384 |
| Specific resistance (μ·cm) | 66 | 7700 | 2180 | 4420 |

|  | Comparative Examples | | |
| --- | --- | --- | --- |
|  | 2-1 | 2-2 | 2-3 |
| Metal powder-containing layer Binder | | | |
| Copolyester | 1 | 1 | 1 |
| Copper particles | | | |
| Copper particles-1 | | | |
| Copper particles-2 | | | |
| Copper particles-3 | | | |
| Copper particles-4 | | | |
| Copper particles-5 | | | |
| Copper particles-6 | | | |
| Copper particles-7 | | | |
| Copper particles-8 | | | |
| Copper particles-9 | 9 | | |
| Copper particles-10 | | 9 | |
| Copper particles-11 | | | 9 |
| Curing agent | | | |
| Blocked isocyanate Before heat treatment | 0.1 | 0.1 | 0.1 |
| Specific resistance (μ·cm) Superheated steam treatment (350° C. × 5 min) | •$10^4$ | •$10^4$ | •$10^4$ |
| Specific resistance (μ·cm) Superheated steam treatment (320° C. × 5 min) | •$10^4$ | 1050 | 1170 |
| Specific resistance (μ·cm) | •$10^4$ | •$10^4$ | •$10^4$ |

INDUSTRIAL APPLICABILITY

The copper particles and the copper paste according to the present invention can provide a copper powder-containing coating film that is suitable for electroless metal plating. For this reason, the conductive coating film produced according to the present invention can be obtained only by electroless metal plating without using an expensive palladium catalyst. The conductive coating film can be suitably used in a copper/resin laminate, a metal thin film forming material for electromagnetic shielding metal thin films, a metal wiring material, a conductive material, or the like.

The conductive coating film obtained according to the present invention can provide a coating film having a good conductivity when produced using copper particles satisfying specific requirements. These conductive coating films can be suitably used in a copper/resin laminate, a conductive coating film forming material for electromagnetic shielding conductive coating films, a metal wiring material, a conductive material, or the like.

The invention claimed is:

1. Copper particles having an average particle diameter of 0.05 to 2 μm as measured by observation using SEM, a BET specific surface area value (SSA) m²/g and a carbon content (C) % by weight of the copper particles satisfying a relationship represented the following formula [1]:

$$C/SSA \leq 7 \times 10^{-2}$$

and an oxygen content (O) % by weight of the copper particles satisfy a relationship represented by the following formula [2]:

$$O/SSA \leq 0.2.$$

wherein a specific resistance of a conductive coating film incorporating the copper particles is not more than 500 μΩ·cm, wherein the conductive coating film is prepared by the following steps:

charging a sand mill with a dispersion composition having the copper particles, the composition having 2.5 parts of a copolyester solution in a form of a 40% by weight solution in toluene/cyclohexanone in a 1/1 weight ratio, 9 parts of the copper particles, 3.5 parts of γ-butyrolactone, 5 parts of methyl ethyl ketone, and 0.2 parts of blocked isocyanate;

dispersing the dispersion composition at 800 rpm for 2 hr with dispersing media of zirconia beads having a radius of 0.2 mm to obtain a copper paste;

applying the obtained copper paste onto a 25 μm-thick polyimide film using an applicator such that the thickness of the coating film obtained after dried is 2 μm;

subjecting the coating film to hot-air drying at 120° C. for 5 min, thereby obtaining a copper powder-containing coating film; and heat-treating the resulting copper powder-containing coating film is heat-treated with superheated steam at 350° C. for 5 min.

2. A copper paste comprising the copper particles as claimed in claim 1, an organic binder and a solvent.

3. The copper paste according to claim 2, further comprising a curing agent.

4. The copper paste according to claim 2, wherein a content of the organic binder resin in the copper paste is 2 to 30 parts by weight based on 100 parts by weight of the copper particles.

5. A process for producing a conductive coating film, comprising the steps of:

forming a coating film on an insulating substrate using the copper paste as claimed in claim 2;

drying the coating film to obtain a copper powder-containing coating film; and then subjecting the resulting coating film to heat treatment with superheated steam.

6. A process for producing a conductive coating film, comprising the steps of:

forming a coating film on an insulating substrate using the copper paste as claimed in claim 2;

drying the coating film to obtain a copper powder-containing coating film; and then subjecting the resulting coating film to electroless metal plating.

7. A conductive coating film produced by the process as claimed in claim 5.

8. A copper paste comprising the copper particles as claimed in claim 1, wherein the specific resistance of the conductive coating film is not more than 100 μΩ·cm.

* * * * *